United States Patent
Ohno et al.

(10) Patent No.: US 6,861,342 B2
(45) Date of Patent: Mar. 1, 2005

(54) ZINC BLENDE TYPE CRSB COMPOUND, METHOD FOR FABRICATING THE SAME, AND MULTILAYERED STRUCTURE

(75) Inventors: Hideo Ohno, Sendai (JP); Fumihiro Matsukura, Sendai (JP)

(73) Assignee: Tohoku University, Sendai (JP)

(*) Notice: Subject to any disclaimer, the term of this patent is extended or adjusted under 35 U.S.C. 154(b) by 0 days.

(21) Appl. No.: 10/172,999

(22) Filed: Jun. 18, 2002

(65) Prior Publication Data

US 2003/0003704 A1 Jan. 2, 2003

(30) Foreign Application Priority Data

Jun. 22, 2001 (JP) ........................................ 2001-189191

(51) Int. Cl.[7] ......................................... H01L 21/3205
(52) U.S. Cl. ...................... 438/602; 257/200; 257/201; 257/198; 438/603; 438/604
(58) Field of Search ........................... 438/3, 603, 604, 438/605

(56) References Cited

U.S. PATENT DOCUMENTS 5,464,990 A * 11/1995 Shiratsuki et al. ............ 257/40
5,563,019 A * 10/1996 Blanchet-Fincher ........ 430/200
6,294,308 B1 * 9/2001 Caspar et al. ................ 430/200

OTHER PUBLICATIONS

Zhao, J. H. et al., "Room–temperature ferromagnetism in zincblende CrSb grown by molecular–beam epitaxy," Applied Physics Letters, vol. 79, No. 17, Oct. 22, 2001, pp. 2776–2778.

Dohnomae, Hitoshi, "X–Ray Diffraction and Electron Microscopy Study of Cr/Sb Multilayered Films," Japanese Journal of Applied Physics, Part 1, No. 3A, Mar. 1994, pp. 1499–1508.

Radhakrishna, P. et al., "Inelastic–neutron–scattering studies of spin–wave excitations in the pnictides MnSb and CrSb," Physical Review B, vol. 54, No. 17, Nov. 1, 1996, pp. 11949–11943.

Dohnomae, H. et al., "Structural and magnetic properties of Cr/Sb multilayers," Applied Surface Science 60/61 (1992), pp. 807–812.

* cited by examiner

*Primary Examiner*—Dung A. Le
(74) *Attorney, Agent, or Firm*—Oliff & Berridge, PLC

(57) ABSTRACT

An underlayer made of a III-V semiconductor compound is formed on a given substrate, and a CrSb compound is epitaxially grown on the underlayer by means of MBE method to fabricate a zinc blend type CrSb compound.

18 Claims, 2 Drawing Sheets

ZINC BLENDE TYPE CRSB COMPOUND, METHOD FOR FABRICATING THE SAME, AND MULTILAYERED STRUCTURE

BACKGROUND OF THE INVENTION

1. Field of the Invention

This invention relates to a zinc blende type CrSb compound, a method for fabricating a zinc blende type CrSb compound and a multilayered structure including a zinc blends type CrSb compound as a ferromagnetic layer.

2. Related Art

With the development of crystal growth technique such as molecular beam epitaxy (MBE method), a different kind of metallic element can be doped into a semiconductor. Particularly, a magnetic semiconductor which is made by doping a magnetic element into a semiconductor has been intensely researched and developed. If a ferromagnetic film is epitaxially grown on a semiconductor, a much higher performance composite device than a conventional one can be provided because conventional semiconductor electronics technique is combined with ferromagnetic properties.

A CrSb compound has been expected as a ferromagnetic material to constitute a ferromagnetic layer of the composite device. With normal epitaxial growth technique, however, only CrSb compound of NiAs type crystal structure can be fabricated. Then, the CrSb compound exhibits antiferromagnetic properties at room temperature. Moreover, such an attempt is made as to fabricate a CrSb/Sb super lattice structure and thus, to create ferromagnetic properties in the structure, but, as of now, can not be realized at room temperature.

SUMMERY OF THE INVENTION

It is an object of the present invention to provide CrSb to exhibit ferromagnetic properties at room temperature and a method for fabricating the CrSb.

In order to achieve the above object, this invention relates to a zinc blende type CrSb compound.

This invention also relates to a method for fabricating a zinc blende type CrSb compound, comprising the steps of:
preparing a given substrate,
forming an underlayer made of a III-V semiconductor compound on the substrate, and
epitaxially growing a CrSb compound on the underlayer by means of MBE method to fabricate a zinc blende type CrSb compound.

The inventors had been intensely studied to achieve the above object. As a result, they found out that the zinc blende type CrSb compound can be fabricated by forming an underlayer made of a III-V semiconductor compound on a given substrate and epitaxially growing a CrSb layer on the underlayer by means of a MBE method, according to the fabricating method of the present invention. In this case, the CrSb layer itself has the zinc blende type crystal structure. The zinc blende type CrSb compound has a much larger ferromagnetic transition temperature than room temperature, and then, can exhibit ferromagnetic properties at room temperature.

That is, if a given CrSb layer is formed according to the present invention, a zinc blende type CrSb compound to exhibit ferromagnetic properties at room temperature can be provided, as mentioned above. Therefore, if a ferromagnetic layer of a given composite device is made of the zinc blende type CrSb compound, the composite device can exhibit extreme device performances.

A multilayered structure according to the present invention can be obtained by performing the fabricating method of the present invention, and then, comprises a given substrate, an underlayer made of a III-V semiconductor compound and formed on the substrate, and a CrSb compound layer having a zinc blende type crystal structure and formed on the underlayer.

In the multilayered structure, the CrSb layer is formed as a ferromagnetic layer on the III-V semiconductor compound layer as an underlayer, so the multilayered structure has a stacking structure of semiconductor layer/ferromagnetic layer. Therefore, the multilayered structure may be preferably employed for the composite device.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
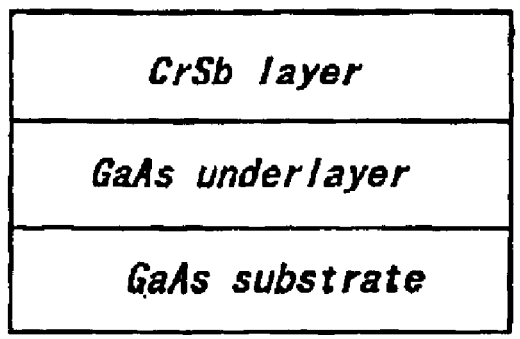
FIG. 1 is a structural view showing a multilayered structure including a zinc blende type CrSb layer according to the present invention.

This invention will be described in detail with reference to the accompanying drawings. In the present invention, an underlayer made of a III-V semiconductor compound is formed on a given substrate, and then, a CrSb layer is epitaxially grown on the underlayer by means of a MBE method. The CrSb layer results in having zinc blende crystal structure.

The thickness of the underlayer is not restricted only if the zinc blende type CrSb compound can be fabricated by means of a MBE method. However, the thickness of the underlayer is preferably set within 2–1000 nm, particularly within 40–400 nm.

The underlayer may be made of a binary, ternary or quaternary III-V semiconductor compound. Particularly, the underlayer is preferably made of a semiconductor compound having a composition of $Al_xGa_{1-x}As$ ($0 \leq X \leq 1$) or $Al_xGa_{1-x}Sb$ ($0 \leq X \leq 1$). In this case, the zinc blende type CrSb compound can exhibit large magnetization at room temperature, and thus, good ferromagnetic performances at room temperature. The underlayer may be made by means of a conventional film-forming method such as a MBE method.

In forming the CrSb layer on the underlayer made of a III-V semiconductor compound, the epitaxial growth temperature is preferably set within 200–600° C., particularly within 250–450° C.

Also, the epitaxial growth rate is preferably set within 3–50 nm/minute, particularly within 8–20 nm/minute.

With the above-mentioned fabricating process, the CrSb layer can exhibit ferromagnetic properties at room temperature because the ferromagnetic transition temperature is 400K or over. The thickness of the CrSb layer is preferably set within 0.3–300 nm. The CrSb layer has zinc blende crystal structure, so the zinc blende type CrSb compound can be obtained from the CrSb layer, and thus, has a layered shape.

It is desired that a buffer layer made of a III-V semiconductor compound is formed between the substrate and the underlayer. In This case, the lattice strain caused by the difference in lattice constant between the substrate and the underlayer can be relaxed effectively. As a result, the ferromagnetic properties of the CrSb layer and thus, the zinc blende type CrSb compound can be developed.

Concretely, in the case of making the underlayer of a semiconductor compound having a composition of $Al_xGa_{1-x}As$ ($0 \leq X \leq 1$), the buffer layer is preferably made of a similar composition material of $Al_YGa_{1-Y}As$ ($0 \leq Y \leq 1$). In the case of making the underlayer of $Al_xGa_{1-x}Sb$ ($0 \leq X \leq 1$), the buffer layer is preferably made of a similar composition material of $Al_YGa_{1-Y}Sb$ ($0 \leq Y1$).

More concretely, in the case of making the underlayer of $Al_xGa_{1-x}As$ ($0 \leq X \leq 1$), the buffer layer is preferably made of GaAs. In the case of making the underlayer of $Al_xGa_{1-x}Sb$ ($0 \leq X \leq 1$), the buffer layer is preferably made of AlSb. The thickness of the buffer layer is appropriately set on the kind of the substrate, the material kind and the thickness of the underlayer.

The buffer layer may be constructed as a multilayered structure which is composed of two or over III-V semiconductor layers. In this case, the lattice strain caused by the difference in lattice constant between the substrate and the underlayer can be relaxed effectively, so that the crystallinity of the CrSb layer and thus, the zinc blende type CrSb can be more enhanced. As a result, the magnetic properties of the zinc blende type CrSb compound can be more enhanced.

The buffer layer may be formed by means of a conventional film-forming method such as a MBE method.

The kind of the substrate to be employed is not restricted, but in view of the epitaxial growth of the underlayer and the buffer layer which are made of III-V semiconductor compounds, the substrate is preferably made of a IIIV-semiconductor compound.

EXAMPLES

The present invention will be described concretely, with reference to Examples.

Example 1

In this Example, a multilayered structure including a zinc blende type CrSb compound shown in FIG. 1 was fabricated. A (001) GaAs substrate was employed and set in a MBE apparatus. Then, the GaAs substrate was heated to 580° C., and an oxide film was desorbed from the GaAs substrate surface. Then, the GaAs substrate was heated to 560° C., and Ga beams and Sb beams were irradiated simultaneously onto the GaAs substrate, to form a GaAs layer as an underlayer in a thickness of 500 nm on the GaAs substrate.

Then, the GaAs substrate was cooled down while the Sb beams were irradiated. The irradiation of the Sb beams was stopped when the GaAs substrate was cooled down to 400° C. Then, Cr beams and Sb beams were irradiated simultaneously onto the GaAs underlayer, to form a CrSb layer in a thickness of 0.6 nm on the GaAs underlayer while the GaAs substrate was held at 250° C.

In this case, the forming rate of the CrSb layer was set to 6 nm/sec. When the crystallinity of the CrSb layer was investigated by means of reflection high-energy electron diffraction (RHEED), it was turned out that the CrSb layer has zinc blende type RHEED pattern.

Example 2

Figure 2:
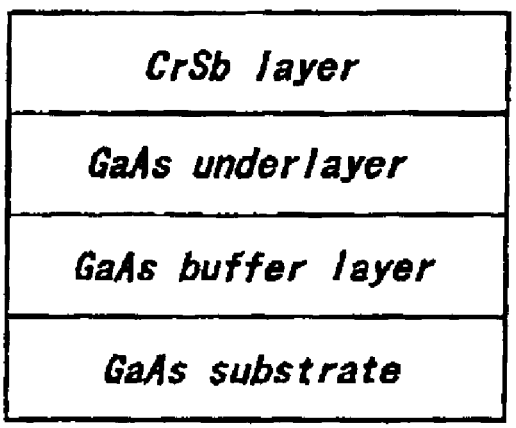
FIG. 2 is a structural view showing another multilayered structure including a zinc blende type CrSb layer according to the present invention.

In this Example, a multilayered structure including a zinc blende type CrSb compound shown in FIG. 2 was fabricated. A (001) GaAs substrate was employed and set in a MBE apparatus, as mentioned in Example 1. Then, an oxide film was desorbed from the GaAs substrate surface in the same manner. Then, the GaAs substrate was heated to 530° C., and a GaAs buffer layer was formed in a thickness of 100 nm on the GaAs substrate by means of a MBE method. Then, Ga beams and Sb beams were irradiated simultaneously onto the GaAs buffer layer, to form a GaSb underlayer in a thickness of 400 nm on the GaAs buffer layer.

Then, a CrSb layer was formed in a thickness of 0.6 nm on the GaSb underlayer in the same manner as in Example 1. When the crystallinity of the CrSb layer was investigated by means of reflection high-energy electron diffraction (RHEED), it was turned out that the CrSb layer has zinc blende type RHEED pattern.

Example 3

Figure 3:
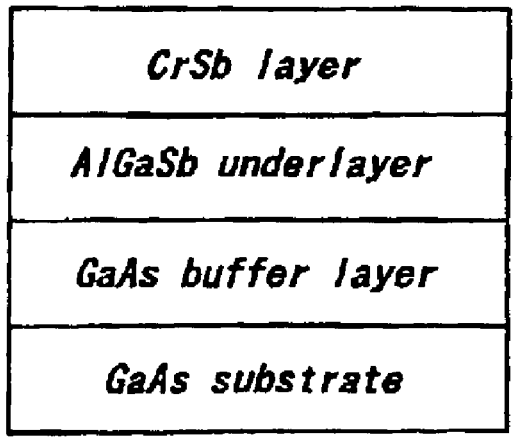
FIG. 3 is a structural view showing still another multilayered structure including a zinc blende type CrSb layer according to the present invention.

In this Example, a multilayered structure including a zinc blende type CrSb compound shown in FIG. 3 was fabricated. A (001) GaAs substrate was employed and set in a MBE apparatus, as mentioned in Example 1. Then, an oxide film was desorbed from the GaAs substrate surface in the same manner. Then, the GaAs substrate was heated to 530° C., and a GaAs buffer layer was formed in a thickness of 100 nm on the GaAs substrate by means of a MBE method. Then, Al beams, Ga beams and Sb beams were irradiated simultaneously onto the GaAs buffer layer, to form an AlGaSb underlayer in a thickness of 400 nm on the GaAs buffer layer.

Then, a CrSb layer was formed in a thickness of 0.3 nm on the AlGaSb underlayer in the same manner as in Example 1. When the crystallinity of the CrSb layer was investigated by means of reflection high-energy electron diffraction (RHEED), it was turned out that the CrSb layer has zinc blende type RHEED pattern.

Figure 4:
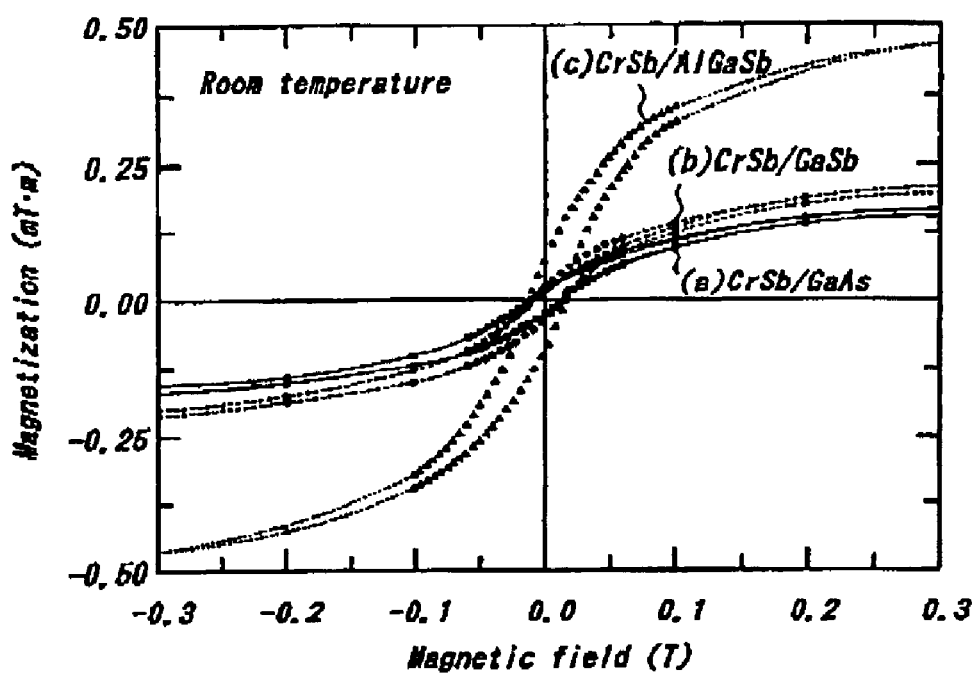
FIG. 4 is a graph showing a magnetic property of a zinc blende type CrSb compound according to the present invention.

FIG. 4 shows the magnetization hysteresis loops of the CrSb layers provided in Example 1–3. As is apparent from FIG. 4, all the CrSb layers exhibit ferromagnetic properties at room temperature. Therefore, all the CrSb layers can be utilized as zinc blende type CrSb compounds according to the present invention.

Also, the magnetization of the CrSb layer provided in Example 2 or 3 is larger than the one of the CrSb layer provided in Example 1 because the CrSb is formed on the GaSb underlayer or the AlGaSb underlayer, instead of the GaAs underlayer. Moreover, the magnetization of the CrSb layer formed on the AlGaSb underlayer in Example 3 is larger than the one of the CrSb layer formed on the GaSb underlayer in Example 2.

Although the present invention was described in detail with reference to the above examples, this invention is not limited to the above disclosure and every kind of variation and modification may be made without departing from the scope of the present invention. For example, in the above embodiments, only one underlayer and only one CrSb layer are prepared, but plural underlayers and plural CrSb layers may be prepared and alternately stacked on the GaAs substrate.

As mentioned above, a zinc blende type CrSb compound to exhibit ferromagnetic properties at room temperature, a method for fabricating the zinc blende type CrSb compound can be provided, according to the present invention. Also, a multilayered structure including the zinc blende type CrSb compound can be provided. Therefore, a composite device composed of semiconductor element and ferromagnetic element can be realized.

What is claimed is:

1. A method for fabricating a zinc blende type CrSb compound, comprising the steps of:

preparing a given substrate, forming an underlayer made of a III-V semiconductor compound on said substrate, and epitaxially growing a CrSb compound on said underlayer by means of MBE method to fabricate a zinc blende type CrSb compound.

2. A fabricating method as defined in claim 1, wherein the thickness of said underlayer is set within 2–1000 nm.

3. A fabricating method as defined in claim 1, wherein said underlayer is made of $Al_xGa_{1-x}As$ ($0 \leq X \leq 1$).

4. A fabricating method as defined in claim 1, wherein said underlayer is made of $Al_xGa_{1-x}Sb$ ($0 \leq X \leq 1$).

5. A fabricating method as defined in claim 1, wherein the epitaxial growth temperature of said CrSb compound is set within 250–400° C.

6. A fabricating method as defined in claim 1, wherein the epitaxial growth rate of said CrSb compound is set within 3–50 nm/minute.

7. A fabricating method as defined in claim 1, further comprising the step of forming a buffer layer made of a III-V semiconductor compound between said substrate and said underlayer.

8. A fabricating method as defined in claim 7, wherein said buffer layer is composed of a multilayered structure made of two or over III-V semiconductor layers.

9. A zinc blende type CrSb compound.

10. A zinc blende type CrSb compound as defined in claim 9, having a layered shape and having a thickness within 0.3–300 nm.

11. A zinc blende type CrSb compound as defined in claim 9, having a ferromagnetic transition temperature of 400K or over.

12. A multilayered structure comprising a given substrate, an underlayer made of a III-V semiconductor compound and formed on said substrate, and a CrSb compound layer having a zinc blende type crystal structure and formed on said underlayer.

13. A multilayered structure comprising a given substrate, plural underlayers made of III-V semiconductor compounds, and plural CrSb compound layers having zinc blende type crystal structures, wherein said underlayers and said CrSb compound layers are alternately stacked on said substrate.

14. A multilayered structure as defined in claim 12, wherein the thickness of said underlayer is set within 2–1000 nm.

15. A multilayered structure as defined in claim 12, wherein said underlayer is made of $Al_xGa_{1-x}As$ ($0 \leq X \leq 1$).

16. A multilayered structure as defined in claim 12, wherein said underlayer is made of $Al_xGa_{1-x}Sb$ ($0 \leq X \leq 1$).

17. A multilayered structure as defined in claim 12, further comprising a buffer layer made of a III-V semiconductor compound between said substrate and said underlayer.

18. A multilayered structure as defined in claim 17, wherein said buffer layer is composed of a multilayered structure made of two or over III-V semiconductor layers.

* * * * *